United States Patent
Kim et al.

(10) Patent No.: US 9,506,695 B2
(45) Date of Patent: Nov. 29, 2016

(54) SUBSTRATE TREATING APPARATUS AND METHOD

(71) Applicant: SEMES CO., LTD., Chungcheongnam-do (KR)

(72) Inventors: Ki-Bong Kim, Chungcheongnam-do (KR); Seong-Soo Kim, Chungcheongnam-do (KR); Woo-Young Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 100 days.

(21) Appl. No.: 14/556,334

(22) Filed: Dec. 1, 2014

(65) Prior Publication Data

US 2015/0155158 A1    Jun. 4, 2015

(30) Foreign Application Priority Data

Nov. 29, 2013 (KR) .................. 10-2013-0147464
Jan. 29, 2014 (KR) .................. 10-2014-0011139

(51) Int. Cl.
*F26B 21/00* (2006.01)
*H01L 21/67* (2006.01)

(52) U.S. Cl.
CPC ....... *F26B 21/003* (2013.01); *H01L 21/67017* (2013.01); *H01L 21/67034* (2013.01); *H01L 21/67051* (2013.01)

(58) Field of Classification Search
CPC ........ F26B 19/00; F26B 21/00; F26B 21/06; F26B 21/003; F26B 25/06; H01L 21/00
USPC ............ 34/77, 78, 79, 80, 413, 497; 134/26, 134/95.2
See application file for complete search history.

(56) References Cited

U.S. PATENT DOCUMENTS

| | | | | |
|---|---|---|---|---|
| 6,920,703 B2 * | 7/2005 | Taktsu | ...................... | G03F 7/40 134/902 |
| 7,322,123 B2 * | 1/2008 | Tadano | .................. | D06F 58/206 34/77 |
| 8,347,525 B2 * | 1/2013 | Gerde | ...................... | B01D 1/18 128/203.15 |
| 9,221,027 B2 * | 12/2015 | Kuppler | ................. | B01J 10/005 |
| 9,275,847 B2 * | 3/2016 | Jung | ...................... | H01L 21/00 |
| 9,275,857 B1 * | 3/2016 | Hersee | ................ | H01L 21/0254 |
| 2008/0213978 A1 * | 9/2008 | Henry | ....................... | B08B 5/00 438/462 |
| 2010/0011610 A1 * | 1/2010 | Bittorf | ...................... | F26B 3/08 34/359 |
| 2011/0220152 A1 * | 9/2011 | Kitajima | .................. | F26B 3/00 134/26 |
| 2014/0290092 A1 * | 10/2014 | Jung | ..................... | B08B 7/0021 34/570 |
| 2015/0155158 A1 * | 6/2015 | Kim | ...................... | F26B 21/003 34/480 |

FOREIGN PATENT DOCUMENTS

JP        08089707 A    *   4/1996
JP    2000-323464 A       11/2000

(Continued)

*Primary Examiner* — Stephen M Gravini
(74) *Attorney, Agent, or Firm* — Carter, DeLuca, Farrell & Schmidt, LLP

(57) ABSTRACT

Provided is a substrate treating apparatus. The substrate treating apparatus includes a first unit, a second unit, a supply line connecting the first unit to the second unit to supply a supercritical fluid from the first unit to the second unit, a flow rate adjustment member disposed in the supply line, and a filter disposed in the supply line to remove foreign substances. The supply line disposed between the flow rate adjustment member and the filter is disposed to get out of a straight line.

20 Claims, 7 Drawing Sheets

(56) References Cited

FOREIGN PATENT DOCUMENTS

| KR | 10-2008-0023854 A | 3/2008 |
| KR | 10-2009-0008384 A | 1/2009 |
| KR | 20110012743 A | 2/2011 |
| KR | 2012-0057504 A | 6/2012 |
| KR | 10-2013-0007396 A | 1/2013 |
| KR | 10-2013-0047472 A | 5/2013 |

* cited by examiner

SUBSTRATE TREATING APPARATUS AND METHOD

CROSS-REFERENCE TO RELATED APPLICATIONS

This U.S. non-provisional patent application claims priority under 35 U.S.C. §119 of Korean Patent Application Nos. 10-2013-0147464, filed on Nov. 29, 2013, and 10-2014-0011139, filed on Jan. 29, 2014, the entire contents of which are hereby incorporated by reference.

BACKGROUND OF THE INVENTION

The present invention disclosed herein relates to a substrate treating apparatus and method.

Semiconductor devices are manufactured by forming a circuit pattern on a substrate through various processes such as a photolithography process. In recent years, a supercritical drying process for drying a substrate by using a supercritical fluid is being used for manufacturing a semiconductor device having a line width of about 30 nm or less. The supercritical fluid may represent a fluid having both gas and liquid characteristics under a critical temperature and pressure. The supercritical fluid has superior diffusion and penetration properties and high dissolubility. Thus, since the supercritical fluid has little surface tension, the supercritical fluid may be very usefully used for drying a substrate.

To perform the supercritical process, a filtered supercritical fluid is supplied into a process chamber. Here, the filtering performance may be considerably different according to the state of the supercritical fluid. When the supercritical fluid is initially supplied, the supercritical fluid may significantly fall in temperature due to adiabatic expansion thereof. In this case, the supercritical fluid changes into a liquid phase to significantly deteriorate the filtering performance. As a result, the supercritical fluid supplied for the process may have low purity.

SUMMARY OF THE INVENTION

The present invention provides a substrate treating apparatus that is capable of supplying a supercritical fluid having high purity.

The object of the present invention is not limited to the aforesaid, but other objects not described herein will be clearly understood by those skilled in the art from descriptions below.

The present invention provides a substrate treating apparatus.

Embodiments of the present invention provide substrate treating apparatuses including: a first unit; a second unit; a supply line connecting the first unit to the second unit to supply a supercritical fluid from the first unit to the second unit; a flow rate adjustment member disposed in the supply line; and a filter disposed in the supply line to remove foreign substances, wherein the supply line disposed between the flow rate adjustment member and the filter is disposed to get out of a straight line.

In some embodiments, the flow rate adjustment member may include an orifice, and the supply line disposed between the orifice and the filter may be disposed in a zigzag shape.

In other embodiments, the supply line disposed between the orifice and the filter may have a length greater than that of the supply line disposed between the filter and the second unit.

In still other embodiments, the supply line disposed between the orifice and the filter may have a length ranging from about 1 meter to about 5 meters.

In even other embodiments, the supply line disposed between the orifice and the filter may have a diameter greater than that of the supply line disposed between the first unit and the orifice.

In yet other embodiments, the orifice may include a first orifice and a second orifice which are disposed in parallel to each other, and the first orifice may have a diameter different from that of the second orifice.

In further embodiments, the first orifice may have a diameter less than that of the second orifice.

In still further embodiments, the substrate treating apparatuses may further include a heating member for heating the supply line disposed between the orifice and the filter.

In even further embodiments, the heating member may include a heater that is disposed to surround the supply line disposed between the orifice and the filter.

In yet further embodiments, the first unit may include a supply tank for storing the supercritical fluid, and the second unit may include a process chamber in which a process is performed by using the supercritical fluid.

The present invention provides a substrate treating method.

In other embodiments of the present invention, substrate treating methods for treating a substrate by using a supercritical fluid include: allowing a supply line disposed between a flow rate adjustment member for adjusting a flow rate of the supercritical fluid when the supercritical fluid is supplied and a filter for removing foreign substances contained in the supercritical fluid to be disposed to get out of a straight line.

In some embodiments, the flow rate adjustment member may include an orifice, and the supply line disposed between the orifice and the filter may be disposed in a zigzag shape.

In other embodiments, the supply line disposed between the orifice and the filter may have a length ranging from about 1 meter to about 5 meters.

In still other embodiments, the supply line disposed between the orifice and the filter may have a diameter greater than that of the supply line disposed between the first unit and the orifice.

In even other embodiments, the substrate treating methods may further include heating the supply line disposed between the orifice and the filter.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

The invention may, however, be embodied in many different forms and should not be construed as being limited to the embodiments set forth herein; rather, these embodiments are provided so that this disclosure will be thorough and complete, and will fully convey the concept of the invention to those skilled in the art. Moreover, it will be understood that although the terms first and second are used herein to describe various elements, these elements should not be limited by these terms. In the following description of the present invention, a detailed description of known functions and configurations incorporated herein will be omitted to avoid making the subject matter of the present invention unclear.

A substrate treating apparatus 100 according to the present invention may be an apparatus for performing a cleaning process on a substrate S.

Here, the substrate S should be construed as sufficiently comprehensive to include all of various wafers such as silicon wafers, glass substrates, and organic substrates that are used for manufacturing semiconductor devices, displays, and objects in which a circuit is formed on a thin film.

Hereinafter, the substrate treating apparatus 100 will be described according to an embodiment.

Figure 1:
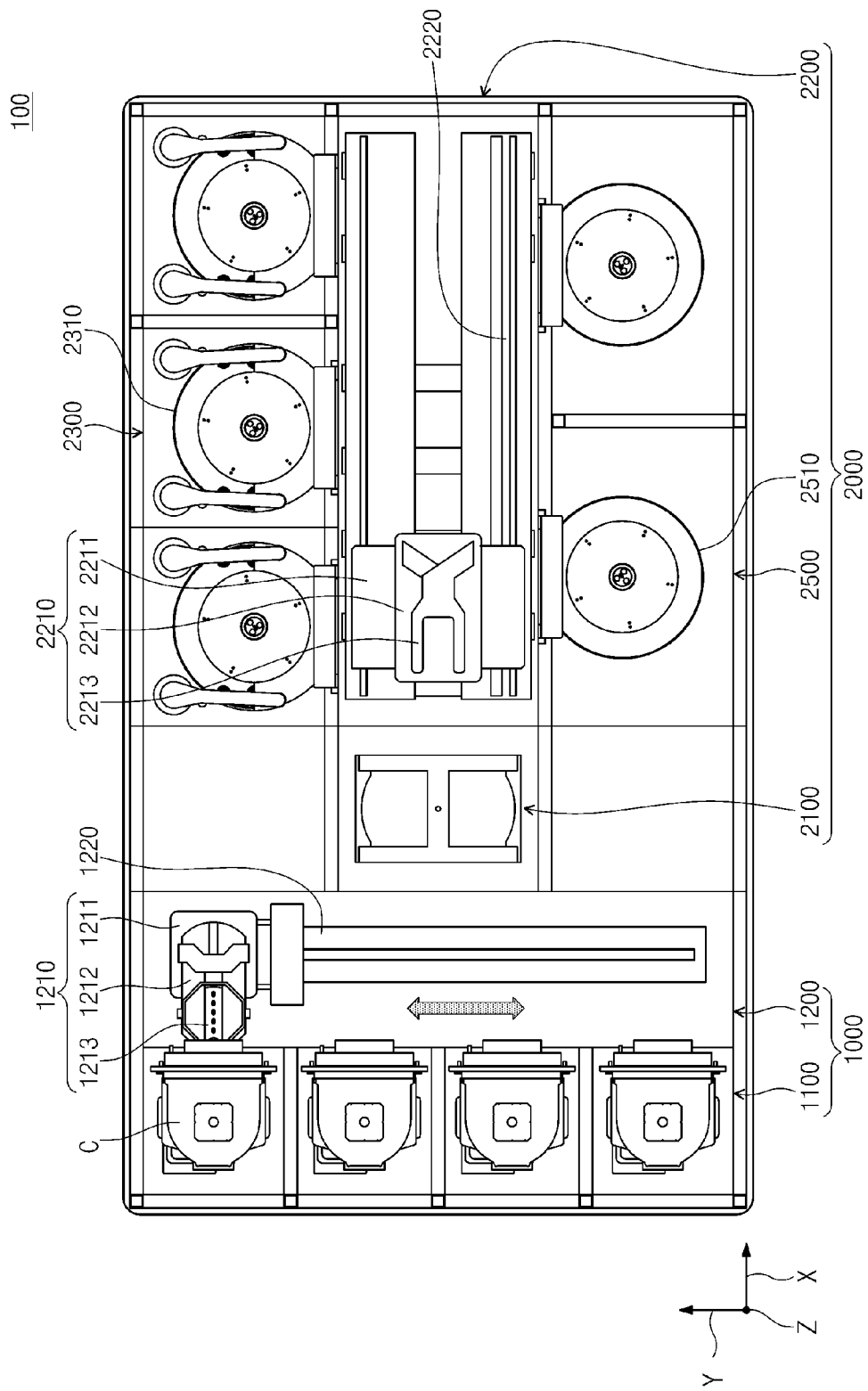
FIG. 1 is a plan view of a substrate treating apparatus according to an embodiment.

FIG. 1 is a plan view of a substrate treating apparatus 100 according to an embodiment.

The substrate treating apparatus 100 includes an index module 1000 and a process module 2000. The index module 1000 receives a substrate S from the outside to provide the substrate S into the process module 2000. The process module 2000 performs a cleaning process on the substrate S.

The index module 1000 may be an equipment front end module (EFEM) and include a loadport 1100 and a transfer frame 1200. The loadport 1100, the transfer frame 1200, and the process module 2000 may be successively arranged in a line. Here, a direction in which the loadport 1100, the transfer frame 1200, the process module 2000 are arranged may be called a first direction X. Also, when viewed from above, a direction perpendicular to the first direction X may be called a second direction Y, and a direction perpendicular to the first and second direction X and Y may be called a third direction Z.

At least one loadport 1100 may be provided in the index module 1000. The loadport 1100 is disposed on a side of the transfer frame 1200. When the loadport 1100 is provided in plurality, the plurality of loadports 1100 may be arranged in a line along the second direction Y. The number and arrangement of loadports are not limited to the above-described example. For example, the number and arrangement of loadports may be adequately selected in consideration of various factors such as a foot print and process efficiency of the substrate treating apparatus 100 and relative placement of the substrate treating apparatus 100 with respect to the other substrate treating apparatus 100.

A carrier C in which the substrate S is accommodated is placed on the loadport 1100. The carrier C is transferred from the outside and then loaded on the loadport 1100, or is unloaded from the loadport 1100 and then transferred to the outside. For example, the carrier C may be transferred between the substrate treating apparatuses by a transfer device such as an overhead hoist transfer (OHT). Selectively, the transferring of the substrate S may be performed by the other transfer device such as an automatic guided vehicle or a rail guided vehicle instead of the OHT or a worker. A front opening unified pod (FOUP) may be used as the carrier C.

At least one slot for supporting an edge of the substrate S may be defined in the carrier C. When the slot is provided in plurality, the slots may be spaced apart from each other along the third direction Z. For example, the carrier C may accommodate 25 sheets of substrates S. The inside of the carrier C may be isolated and sealed from the outside by an openable door. Thus, it may prevent the substrate S accommodated in the carrier C from being contaminated.

The transfer frame 1200 transfers the substrate S between the carrier seated on the loadport 1100 and the process module 2000. The transfer frame 1200 includes an index robot 1210 and an index rail 1220.

The index rail 1220 guides linear movement of the index robot 1210. The index rail 1220 may have a longitudinal direction that is parallel to the second direction Y.

The index robot 1210 transfers the substrate S. The index robot 1210 may include a base 1211, a body 1212, and an arm 1213.

The base 1211 is disposed on the index rail 1220. The base 1211 may move along the index rail 1220. The body 1212 is coupled to the base 1211 to move in the third direction Z or rotate by using the third direction Z as a rotation axis on the base 1211. The arm 1213 is disposed on the body 1212 to move forward and backward. A hand may be disposed on an end of the arm 1213 to pick up or out the substrate S. At least one arm 1213 may be provided on the index robot 1210. When the arm 1213 is provided in plurality, the plurality of arms 1213 may be stacked on the body 1212 in the third direction Z. Here, the stacked arms 1213 may be individually driven.

Thus, the base 1211 of the index robot 1210 may move along the index rail 1220 in the second direction Y. As the body 1212 and the arm 1213 operate, the substrate S may be taken out of the carrier C and then be loaded into the process chamber 2000, or the substrate S may be taken out of the process module 2000 and then be accommodated into the carrier C.

On the other hand, the index rail 1220 may not be provided on the transfer frame 1200. Thus, the index robot 1210 may be fixed to the transfer frame 1200. Here, the index robot 1210 may be disposed at a center portion of the transfer frame 1200.

The process module 2000 performs the cleaning process on the substrate S. The process module 2000 includes a buffer chamber 2100, a transfer chamber 2200, a first process chamber 2300, and a second process chamber 2500. The buffer chamber 2100 and the transfer chamber 2200 are disposed in the first direction X, and the transfer chamber 2200 has a longitudinal direction that is parallel to the first direction X. The process chambers 2300 and 2500 are disposed on a side surface of the transfer chamber 2200. The first process chamber 2300, the transfer chamber 2200, and the second process chamber 2500 may be successively arranged in the second direction Y.

The first process chamber 2300 may be disposed on one side of the transfer chamber 2200 in the second direction Y, and the second process chamber 2500 may be disposed on the other side opposite to the first process chamber 2300. The first process chamber 2300 may be provided in one or plurality. When the first process chamber 2300 is provided in plurality, the first process chambers 2300 may be arranged on a side of the transfer chamber 2200 in the first direction X, be stacked in the third direction Z, or be disposed by the combination thereof. Similarly, the second process chamber 2500 may be provided in one or plurality. When the second process chamber 2500 is provided in plurality, the second process chambers 2500 may be arranged on the other side of the transfer chamber 2200 in the first direction X, be stacked in the third direction Z, or be disposed by the combination thereof.

However, the arrangement of the chambers in the process module 2000 is not limited to the above-described example. For example, the arrangement of the chambers may be adequately modified in consideration of the process efficiency. For example, as occasion demands, the first process chamber 2300 and the second process chamber 2500 may be disposed on the side surface, on which the transfer module is disposed, in the first direction X or stacked on each other.

The buffer chamber 2100 is disposed between the transfer frame 1200 and the transfer chamber 2200. The buffer chamber 2100 provides a buffer space in which the substrate S to be transferred between the index module 1000 and the process module 2000 temporarily stays. At least one buffer slot in which the substrate S is placed may be provided in the buffer chamber 2100. When the buffer slot is provided in plurality, the buffer slots may be spaced apart from each other in the third direction Z.

The substrate S that is taken out of the carrier C by the index robot 1210 may be seated on the buffer slot. Also, the substrate S that is taken out of the process chambers 2300 and 2500 by the transfer robot 2210 may be seated on the buffer slot. Also, the index robot 1210 or the transfer robot 2210 may take the substrate S out of the buffer slot to accommodate the substrate S into the carrier C or transfer the substrate S into the process chambers 2300 and 2500.

The transfer chamber 2200 transfers the substrate between the buffer chamber 2100, the first process chamber 2300, and the second process chamber 2500. The transfer chamber 2200 includes a transfer rail 2220 and a transfer robot 2210. The transfer rail 2220 provides a path along which the transfer robot 2210 moves.

The transfer rail 2220 may be disposed parallel to the first direction X. The transfer robot 2210 transfers the substrate S. The transfer robot 2210 may include a base 2211, a body 2212, and an arm 2213. Since the components of the transfer robot 2210 are similar to those of the index robot 1210, their detailed descriptions will be omitted. The transfer robot 2210 may transfer the substrate S between the buffer chamber 2100, the first process chamber 2300, and the second process chamber 2500 by the operations of the body 2212 and the arm 2213 while the base 2211 moves along the transfer rail 2220.

The first process chamber 2300 and the second process chamber 2500 may perform different processes on the substrate S. Here, a first process performed in the first process chamber 2300 and a second process performed in the second process chamber 2500 may be successively performed. For example, a chemical process, a cleaning process, and a first drying process may be performed in the first process chamber 2300, and a second drying process that is a following process of the first process may be performed in the second process chamber 2500. Here, the first drying process may be a drying process that is performed by using an organic solvent, and the second drying process may be a supercritical process that is performed by using a supercritical fluid.

Figure 2:
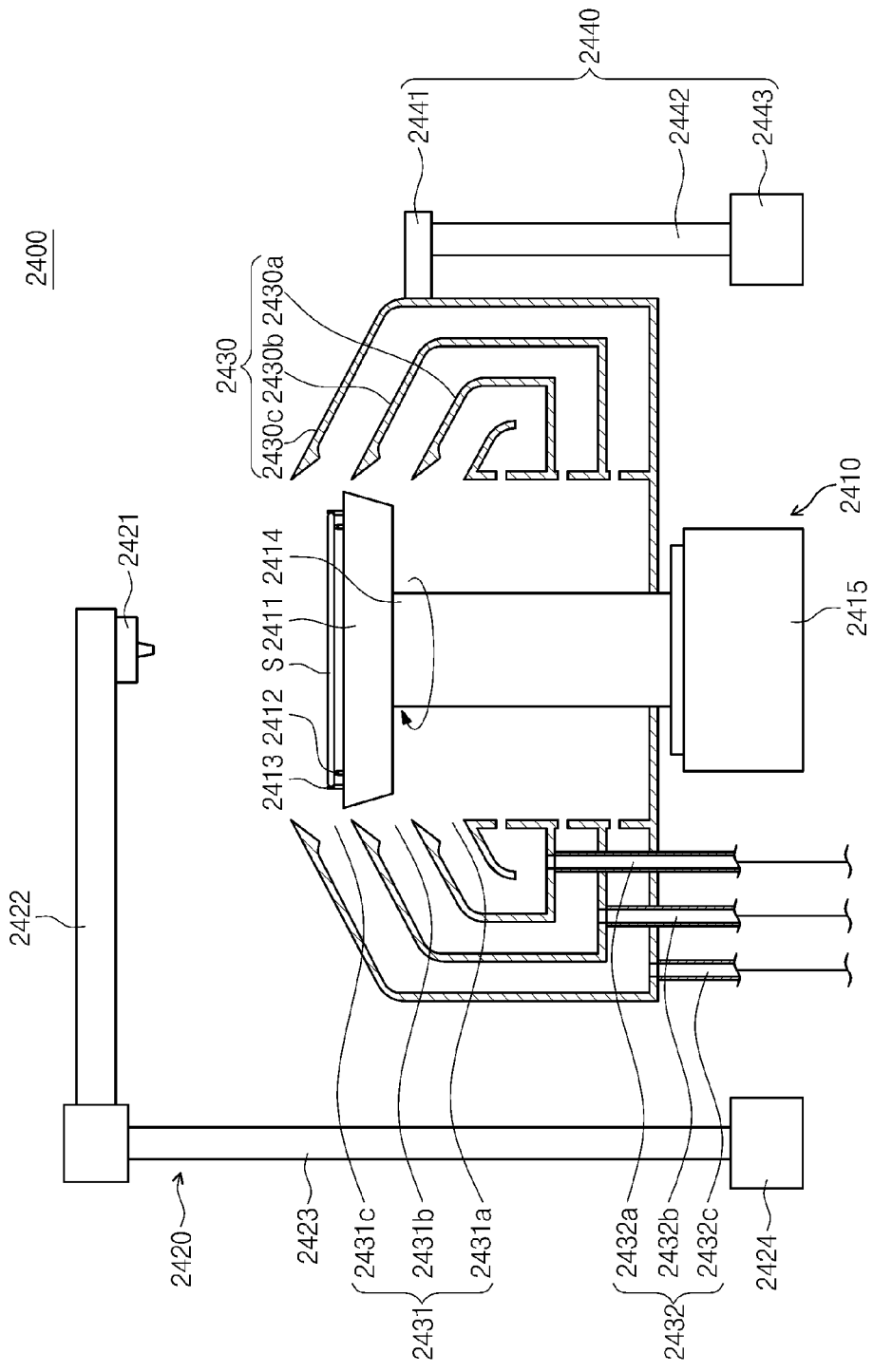
FIG. 2 is a cross-sectional view of a process chamber 1 of FIG. 1.

Hereinafter, the first process chamber 2300 will be described. FIG. 2 is a cross-sectional view of the first process chamber 2300 of FIG. 1.

The first process is performed in the first process chamber 2300. The first process chamber 2300 includes a housing 2310 and a process unit 2400. The housing 2310 defines an outer wall of the first process chamber 2300. The process unit 2400 is disposed inside the housing 2310 to perform the first process.

The process unit 2400 may include a spin head 2410, a fluid supply member 2420, a collection box 2430, and an elevation member 2440.

The substrate S is seated on the spin head 2410. The spin head 2410 rotates the substrate S while the process is performed. The spin head 2410 may include a support plate 2411, a support pin 2412, a chucking pin 2413, a rotation shaft 2414, and a motor 2415.

The support plate 2411 may have an upper portion having a shape similar to that of the substrate S. For example, when the substrate includes a circular wafer, the support plate 2411 may have a circular shape. A plurality of support pins 2412 and a plurality of chucking pins 2413 are provided on the support plate 2411. The substrate S is placed on the plurality of support pins 2412. The plurality of chucking pin 2413 fix the substrate S. A rotation shaft 2414 is fixed and coupled to a bottom surface of the support plate 2411. The rotation shaft 2414 rotates by the motor 2415. The motor 2415 may generate a rotation force to rotate the support plate 2411 through the rotation shaft 2414. Thus, the substrate S may be seated on the spin head 2410 to rotate while the first process is performed.

The plurality of support pins 2412 protrude from a top surface of the support plate 2411 in the third direction Z. When viewed from above, the support pins 2412 may generally have an annular ring shape. A back surface of the substrate S is placed on the support pins 2412. Thus, the substrate S may be seated spaced a distance, by which the support pin 2412 protrudes, from the top surface of the support plate 2411 by the support pins 2412.

The chucking pin 2413 may further protrude from the top surface of the support plate 2411 than the support pin 2412 in the third direction Z. The chucking pin 2413 is disposed that is far away from a center of the support plate 2411 than the support pin 2412. The chucking pins 2413 may move between a support position and a standby position along a radius direction of the support plate 2411. The support position may be defined at a position that is spaced a distance that corresponds to a radius of the substrate S from the center of the support plate 2411. The standby position may be a position that is far away from the center of the support plate 2411 than the support position. The chucking pin 2413 may be disposed at the standby position when the substrate S is loaded onto or unloaded from the spin head 2410. Also, the chucking pin 2413 may move to the support position while the process is performed. Thus, the chucking pins 2413 may prevent the substrate S from being separated from the proper position by a rotation force thereof when the spin head 2410 rotates.

The fluid supply member 2420 supplies a fluid onto the substrate S. The fluid supply member 2420 includes a nozzle 2421, a support 2422, a support shaft 2423, and a driver 2424. The support shaft 2423 may have a longitudinal direction along the third direction Z. The driver 2424 is coupled to a lower end of the support shaft 2423. The driver 2424 may rotate the support shaft 2423 or vertically move the support shaft 2423 in the third direction Z. The support 2422 is vertically coupled to an upper portion of the support shaft 2423. The nozzle 2421 is disposed on a bottom surface of an end of the support 2422. The nozzle 2421 may move between the support position and the standby position by the rotation and elevation of the support shaft 2423. The support position may be a position that is disposed directly above the support plate 2411. The standby position may be a position that gets out of the directly upper side of the support plate 2411.

At least one fluid supply member 2420 may be provided in the process unit 2400. When the fluid supply member 2420 is provided in plurality, the fluid supply member 2420 may supply fluids different from each other. For example, each of the plurality of fluid supply members 2420 may supply a cleaning agent, a rinsing agent, or an organic solvent. The cleaning agent may include hydrogen peroxide ($H_2O_2$), ammonia ($NH_4OH$), hydrogen peroxide ($H_2SO_4$), hydrofluoric acid (HF), or a mixture thereof. Deionized water (DI-water) may be used as the rinsing agent, and isopropyl alcohol may be used as the organic solvent. Selectively, the organic solvent may include ethyl glycol, 1-propanol, tetra hydraulic franc, 4-hydroxyl, 4-methyl, 2-pentanone, 1-butanol, 2-butanol, methanol, ethanol, n-propyl alcohol, or dimethylether. For example, the first fluid supply member 2420a may spray an ammonia-hydrogen peroxide solution, the second fluid supply member 2420b may spray the ID-water, and the third fluid supply member 2420c may spray an isopropyl alcohol solution. However, the organic solvent may not be provided in a liquid state, but provided in a gaseous state. When the organic solvent is provided as vapor having the gaseous state, the organic solvent may be mixed with an inert gas.

The above-described fluid supply member 2420 may move from the standby position to the support position when the substrate S is seated on the spin head 2410 to supply the above-described fluid onto the substrate S. For example, as the fluid supply member supplies the cleaning agent, the rinsing agent, and the organic solvent, each of the chemical process, the cleaning process, and the first drying process may be performed. While the above-described processes are performed, the spin head 2410 may rotate to uniformly supply the fluids onto the substrate S.

The collection box 2430 provides a space in which the first process is performed and collects the fluid that is used in this process. When viewed from above, the collection box 2430 may be disposed around the spin head 2410 to surround the spin head 2410. Here, the collection box 2430 may have an opened upper portion. At least one collection box 2430 may be provided in the process unit 2400. Hereinafter, a case in which three collection boxes 2430, i.e., a first collection box 2430a, a second collection box 2430b, and a third collection box 2430c are provided will be described as an example. However, the number of collection boxes 2430 may be differently selected according to the number of fluids and conditions of the first process.

Each of the first collection box 2430a, the second collection box 2430b, and the third collection box 2430c may have an annular ring shape that surrounds the spin head 2410. The first collection box 2430, second collection box 2430b, and the third collection box 2430c may be successively disposed in a direction that is away from a center of the spin head 2410. The first collection box 2340a surrounds the spin head 2410, the second collection box 2430b surrounds the first collection box 2430a, and the third collection box 2430c surrounds the second collection box 2430b.

A first inflow hole 2431a is provided in the first collection box 2430a by an inner space of the first collection box 2430a. A second inflow hole 2431b is provided in the second collection box 2430b by a space between the first collection box 2430a and the second collection box 2430b. A third inflow hole 2431c is provided in the third collection box 2430c by a space between the second collection box 2430b and the third collection box 2430c. The first inflow hole 2431a, the second inflow hole 2431b, and the third inflow hole 2431c may be successively arranged downward from an upper side along the third direction Z. A collection line 2432 extending downward along the third direction Z is connected to a bottom surface of each of the collection boxes 2430a, 2430b, and 2430c. Each of the collection lines 2432a, 2432b, and 2432c may discharge the fluids collected by the collection boxes 2430a, 2430b, and 2430c to supply the fluids into an external fluid recycling system (not shown). The fluid recycling system (not shown) may recycle the collected fluids to reuse the fluids.

The elevation member 2440 includes a bracket 2411, an elevation shaft 2442, and an elevator 2443. The bracket 2441 is fixed to the collection box 2430. The elevation shaft 2442 moving by the elevator 243 in the third direction Z is fixed and coupled to an end of the bracket 2441. When the collection box 2430 is provided in plurality, the bracket 2441 may be coupled to the outermost collection box 2430.

The elevation member 2440 moves the collection box 2430 in the third direction Z. Thus, when the collection box 2430 is provided in plurality, a relative height of the collection box 2430 with respect to the spin head 2410 may change to selectively adjust a height of the inflow hole 2431 of one collection box 2430 so that the inflow hole 2431 is defined on a horizontal plane of the substrate S that is seated on the spin head 2410.

Also, the elevation member 2440 may move the collection box 2430 in the third direction Z while the first process is performed to adjust a height of the inflow hole 2431 of the collection box 2430 so that the inflow hole 2431 corresponds to the substrate S. Thus, as the substrate S rotates, the fluid bounced off the substrate S may be collected. For example, when the chemical process that is the first process, the cleaning process using the rinsing agent, and the first drying process using the organic solvent are successively performed, the elevation member 2440 may successively move the first inflow hole 2431a, the second inflow hole 2431b, and the third inflow hole 2431c. Thus, each of the first, second, and third collection boxes 2430a, 2430b, and 2430c may collect the fluid.

The elevation member 2440 may not move the collection box 2430, but move the spin head 2410 in the third direction Z.

Hereinafter, the second process chamber 2500 will be described.

The second process is performed in the second process chamber 2500. Here, the second process may be a second drying process for drying the substrate S by using a supercritical fluid.

Hereinafter, carbon dioxide ($CO_2$) that is used as the supercritical fluid will be described as an example. However, the present invention is not limited to kinds of supercritical fluids.

Figure 3:
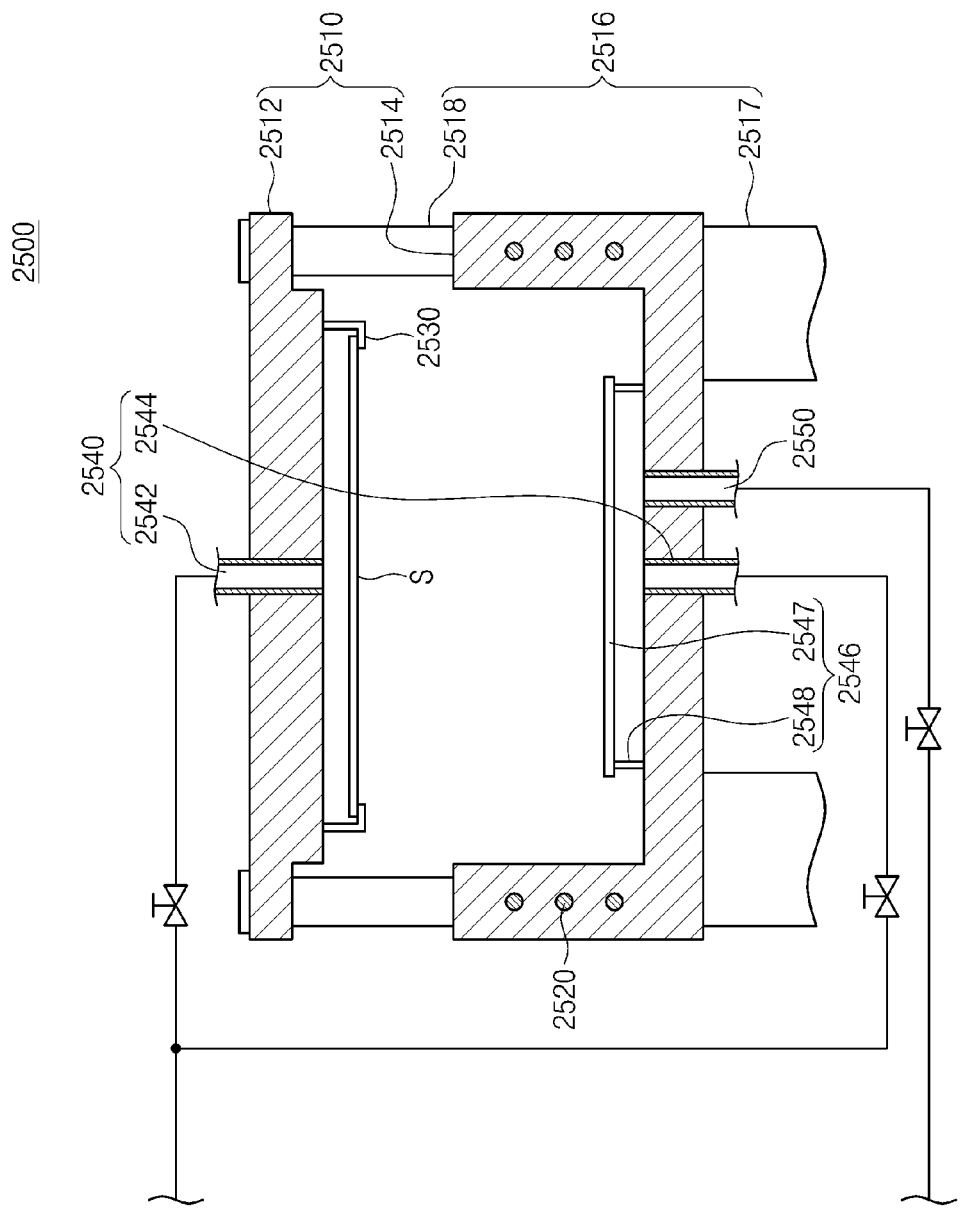
FIG. 3 is a cross-sectional view of a second process chamber of FIG. 1 according to an embodiment.

FIG. 3 is a cross-sectional view of the second process chamber 2500 of FIG. 1 according to an embodiment. Referring to FIG. 3, the second process chamber 2500 may include a housing 2510, an elevation member 2516, a support member 2530, a heating member 2520, a supply port 2540, a blocking member 2546, and an exhaust port 2550.

The housing 2510 may provide a space in which a supercritical drying process is performed. The housing 2510 may be formed of a material that is capable of enduring a high pressure greater than a critical pressure.

The housing 2510 may include an upper housing 2512 and a lower housing 2514 disposed under the upper housing 2512. That is, the housing 2510 may have a structure which is divided into upper and lower portions.

The upper housing 2512 is fixed, and the lower housing 2514 may be elevated. When the lower housing 2514 descends and then is spaced from the upper housing 2512, an inner space of the second process chamber 2500 may be opened. Thus, the substrate S may be loaded into or unloaded from the inner space of the second process chamber 2500. Here, the substrate S loaded into the second process chamber 2500 may be in a state in which the organic solvent remains after an organic solvent process is performed in the first process chamber 3000. Also, when the lower housing 2514 ascends and then is closely attached to the upper housing 2512, the inner space of the second process chamber 2500 may be sealed, and the supercritical drying process may be performed in the inner space. Unlike the above-described example, the lower housing 2514 may be fixed to the housing 2510, and the upper housing 2512 may be elevated.

The elevation member 2516 elevates the lower housing 2514. The elevation member 2516 may include an elevation cylinder 2517 and an elevation rod 2518. The elevation cylinder 2517 is coupled to the lower housing 2514 to generate a vertical driving force, i.e., an elevating force. The elevation cylinder 2517 may endure the high pressure that is above the critical pressure within the second process chamber 2500 while the supercritical drying process is performed. Also, the elevation cylinder 2517 may generate a driving force that is enough to closely attach the upper and lower housings 2512 and 2514 to each other to seal the inside of the second process chamber 2500. The elevation rod 2518 has one end inserted into the elevation cylinder 2517 and the other end extending upward and coupled to the upper housing 2512. Due to the above-described structure, when the driving force is generated in the elevation cylinder 2517, the elevation cylinder 2517 and the elevation rod 2518 may relatively ascend to allow the lower housing 2514 coupled to the elevation cylinder 2517 to ascend. Also, while the lower housing 2514 ascends by the elevation cylinder 2517, the elevation rod 2518 may prevent the upper and lower housings 2512 and 2514 from horizontally moving and may guide an elevation direction to prevent the upper and lower housings 2512 and 2514 from being separated from the proper positions thereof.

The support member 2530 supports the substrate S between the upper housing 2512 and the lower housing 2514. The support member 2530 may be disposed on a bottom surface of the upper housing 2512 to extend directly downward. Also, the support member 2530 may be perpendicularly bent from a lower end of the upper housing 2512 in a horizontal direction. Thus, the support member 2530 may support an edge region of the substrate S. As described above, since the support member 2530 contacts the edge region of the substrate S to support the substrate S, the supercritical drying process may be performed on an entire area of a top surface of the substrate S and most areas of a bottom surface of the substrate S. Here, the top surface of the substrate S may be a pattern surface, and the bottom surface of the substrate S may be a non-pattern surface. Also, since the fixed upper housing 2512 is provided, the support member 2530 may relatively stably support the substrate S while the lower housing 2514 is elevated.

A horizontal adjustment member 2532 may be disposed on the upper housing 2512 on which the support member 2530 is disposed. The horizontal adjustment member 2532 may adjust horizontality of the upper housing 2512.

When the upper housing 2512 is adjusted in horizontality, the substrate S seated on the support member 2530 disposed in the upper housing 2512 may be adjusted in horizontality. When the substrate S is sloped in the supercritical drying process, the organic solvent remaining on the substrate S may flow along a sloop to cause a phenomenon in which a specific portion of the substrate S is not dried or is overdried, thereby damaging the substrate S. The horizontal adjustment member 2532 may adjust horizontality of the substrate S to prevent the above-described phenomenon from occurring. Of cause, when the upper housing 2512 ascends, and the lower housing 2514 is fixed, or when the support member 2530 is disposed in the lower housing 2514, the horizontal adjustment member 2532 may be provided in the lower housing 2514.

The heating member 2520 may heat the inside of the second process chamber 2500. The heating member 2520 may heat the supercritical fluid supplied into the second process chamber 2500 at a temperature greater than a critical temperature to maintain the supercritical fluid to a supercritical fluid phase or change again into the supercritical fluid if the supercritical fluid is liquefied. The heating member 2520 may be embedded in at least one wall of the upper and lower housings 2512 and 2514. For example, the heating member 2520 may be provided as a heater for receiving a power from the outside to generate heat.

The supply port 2540 supplies the supercritical fluid to the second process chamber 2500. The supply port 2540 may be connected to the supply unit 2560. Here, a valve for adjusting a flow rate of the supercritical fluid supplied from the supply unit 2560 may be disposed in the supply port 2540.

The supply port 2540 may include an upper supply port 2542 and a lower supply port 2544. The upper supply port 2542 may be provided in the upper housing 2512 to supply the supercritical fluid onto the top surface of the substrate S that is supported by the support member 2530. The lower supply port 2544 may be provided in the lower housing 2514 to supply the supercritical fluid onto the bottom surface of the substrate S that is supported by the support member 2530.

The supply ports 2550 may spray the supercritical fluid onto a central area of the substrate S. For example, the upper supply port 2542 may be disposed at a position that is disposed directly above a center of the top surface of the substrate S supported by the support member 2530. Also, the lower supply port 2544 maybe disposed at a position that is disposed directly below the center of the substrate S supported by the support member 2530. Thus, the supercritical fluid sprayed through the supply port 2540 may reach the central area of the substrate S and then be spread to the edge area of the substrate S. As a result, the supercritical fluid may be uniformly supplied onto the entire area of the substrate S.

In the upper and lower supply ports 2542 and 2544, the lower supply port 2544 may supply the supercritical fluid, and then the upper supply port 2542 may supply the supercritical fluid. Since the supercritical drying process is performed in a state where an internal pressure of the second process chamber 2500 is less than the critical pressure, the supercritical fluid supplied into the second process chamber 2500 may be liquefied. Thus, when the supercritical fluid is supplied into the upper supply port 2542 during an initial supercritical drying process, the supercritical fluid may be liquefied to drop onto the substrate S by the gravity thereof, thereby damaging the substrate S. When the supercritical fluid is supplied into the second process chamber 2500 through the lower supply port 2544 to allow the internal pressure of the second process chamber 2500 to reach the supercritical pressure, the upper supply port 2542 may start the supply of the supercritical fluid to liquefy the supercritical fluid, thereby preventing the supercritical fluid from dropping onto the substrate S.

The blocking member 2546 may prevent the supercritical fluid supplied through the supply port 2540 from being directly sprayed onto the substrate S. The blocking member 2546 may include a blocking plate 2547 and a support 2548.

The blocking plate 2547 is disposed between the supply port 2540 and the substrate S supported by the support member 2530. For example, the blocking plate 2547 may be disposed between the lower supply port 2544 and the support member 2530 and be disposed under the substrate S. The blocking plate 2547 may prevent the supercritical fluid supplied through the lower supply port 2544 from being directly sprayed onto the bottom surface of the substrate S.

The blocking plate 2547 may have a radius similar to or greater than that of the substrate S. In this case, the blocking plate 2547 may completely prevent the supercritical fluid from being directly sprayed onto the substrate S. Also, the blocking plate 2547 may have a radius less than that of the substrate S. In this case, the direct spraying of the supercritical fluid onto the substrate S may be prevented, and also, the velocity of the supercritical fluid may be minimized. Thus, the supercritical fluid may more easily reach the substrate S to effectively perform the supercritical drying process on the substrate S.

The support 2548 supports the blocking plate 2547. That is, the blocking plate 2547 may be disposed on an end of the support 2548. The support 2548 may extend directly upward from the bottom surface of the housing 2510.

The support 2548 and the blocking plate 2547 may be disposed so that the blocking plate 2547 is simply placed on the support 2548 by the gravity thereof without using a separate coupling unit. When the support 2548 and the blocking plate 2547 are coupled to each other by using a coupling unit such as a nut or bolt, the supercritical fluid having high penetrability may be penetrated between the support 2548 and the blocking plate 2547 to generate contaminants. Alternatively, the support 2548 and the blocking plate 2547 may be integrated with each other.

When the supercritical fluid is supplied through the lower supply port 2544 during the initial supercritical drying process, since an internal pressure of the housing 2519 is low, the supplied supercritical fluid may be sprayed at a high speed. When the supercritical fluid sprayed at the high speed directly reaches the substrate S, a leaning phenomenon in which a portion of the substrate S onto which the supercritical fluid is directly sprayed is bent by a physical pressure of the supercritical fluid may occur. Also, the substrate may be shaken by the spraying force of the supercritical fluid. Here, the organic solve remaining on the substrate S may flow to damage a circuit pattern of the substrate S.

Thus, the blocking plate 2547 disposed between the lower supply port 2544 and the support member 2530 may prevent the supercritical fluid from being directly sprayed onto the substrate S to prevent the substrate S from being damaged by the physical force of the supercritical fluid. After the process is performed, the supercritical fluid may be exhausted into the recycling unit 2570 through the exhaust port 2550.

The second drying process is performed in the second process chamber 2500 by using the supercritical fluid. For example, the second drying process may be performed on the substrate S, on which the chemical process, the cleaning process, and the first drying process using the organic solvent are successively performed in the first process chamber 2300, by using the supercritical fluid in the second process chamber 2500. Hereinafter, the second process chamber 2500 will be called a drying chamber 2500. When the substrate S is seated on the support member 2530 by the transfer robot 2210, the heating member 2520 heats the inside of the housing 2510 to supply the supercritical fluid through the supercritical fluid supply tube 2540. As a result, a supercritical atmosphere may be formed in the housing 2510. When the supercritical atmosphere is formed, the organic solvent remaining on a top surface of the pattern of the substrate S may be dissolved by the supercritical fluid. When the organic solvent is sufficiently dissolved, the supercritical fluid may be discharged through a discharge hole. Thereafter, the supercritical fluid is supplied again into the supply unit 2560. That is, the supply unit 2560 supplies the supercritical fluid into the drying chamber 2500, and the recycling unit 2570 recycles the supercritical fluid that is used in the drying chamber 2500 to supply the recycled supercritical fluid into the supply unit 2560.

Figure 4:
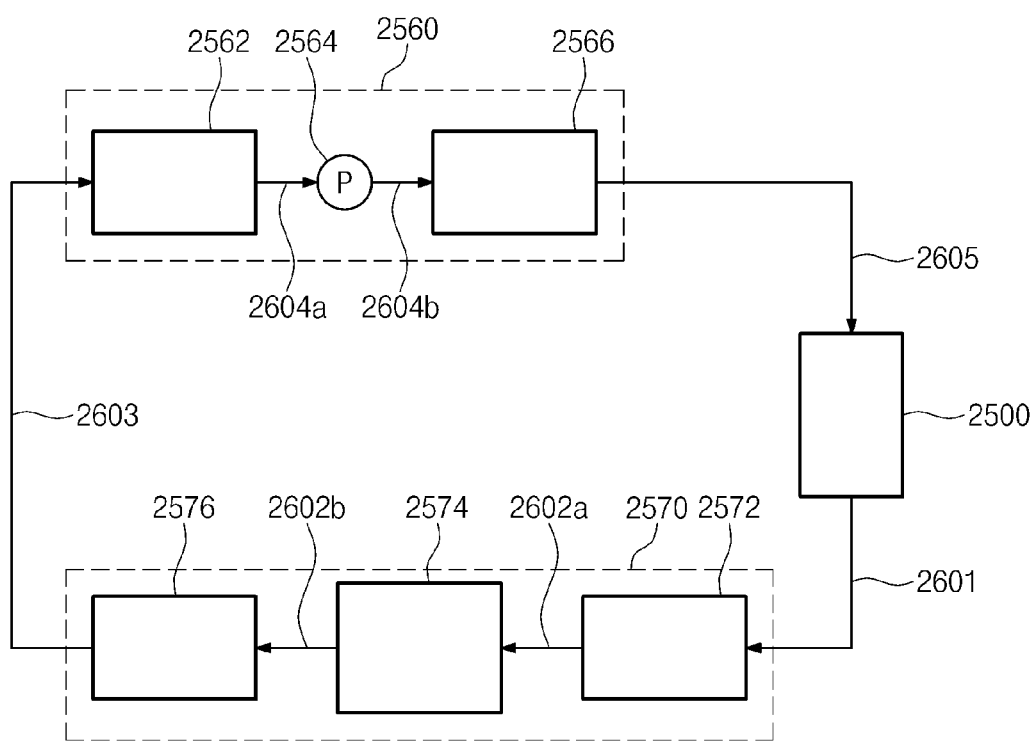
FIG. 4 is a view of a supply system of a supercritical fluid.

FIG. 4 is a view of a supply system of the supercritical fluid. The substrate treating apparatus 100 includes the drying chamber 2500, a supply unit 2560, a recycling unit 2570, and a circulation line 2600. After the above-described drying process is performed in the drying chamber 2500, the supercritical fluid may be exhausted into the recycling unit 2570 through the exhaust port 2550. The recycling unit 2570 may recycle the supercritical fluid used in the drying chamber 2500 to supply the recycled supercritical fluid into the supply unit 2560. The supply port 2560 supplies the supercritical fluid again into the drying chamber 2500.

The process unit 2560 may include a condenser 2562, a pump 2564, and a water supply tank 2566. The condenser 2562 liquefies the carbon dioxide. The carbon dioxide supplied from the outside or the recycling unit 2570 may be a gaseous state. The condenser 2562 may change the carbon dioxide into a liquid state to supply the liquefied carbon dioxide into the water supply tank 2566. The pump 2564 may be disposed between the condenser 2562 and the water supply tank 2566. Here, the pump 2564 may be disposed on the circulation line between the condenser 2562 and the water supply tank 2566. The pump 2564 supplies the liquefied carbon dioxide into the water supply tank 2564. The water supply tank 2566 receives the carbon dioxide liquefied in the condenser 2562 to generate the supercritical fluid. The water supply tank 2566 may heat the supplied carbon dioxide at a temperature greater than the critical temperature to generate the supercritical fluid, thereby supplying the supercritical fluid into the drying chamber 2500.

The recycling unit 2570 includes a separator 2572 and a recycler 2574. The recycling unit 2570 may recycle the supercritical fluid, which is used for the second drying process in the drying chamber 2500 to contain the organic solvent, to supply the supercritical fluid into the supply unit 2560. The separator 2572 may cool the carbon dioxide to liquefy the organic solvent contained in the carbon dioxide, thereby primarily separating the organic solvent from the carbon dioxide. The recycler 2574 may allow the carbon dioxide to pass through a space in which an absorbent A for absorbing the organic solvent is provided, thereby secondarily separating the organic solvent from the carbon dioxide.

The recycling unit 2570 includes the separator 2572, the recycler 2574, and a liquefying tank 2576. The recycling unit 2570 may recycle the supercritical fluid, which is used in the drying chamber 2500 to contain the organic solvent, to supply the recycled supercritical fluid into the supply unit 2560. The separator 2572 may cool the carbon dioxide to liquefy the organic solvent contained in the carbon dioxide, thereby primarily separating the organic solvent from the carbon dioxide. The recycler 2574 may allow the carbon dioxide to pass through a space in which an absorbent A for absorbing the organic solvent is provided, thereby secondarily separating the organic solvent from the carbon dioxide. The absorbent A has a plurality of pores to absorb the organic solvent in the pores. For example, zeolite may be used as the absorbent. The liquefying tank 2576 may liquefy the carbon dioxide passing through the recycler 2576.

The recycling unit 2570 may include a plurality of separators 2572. Here, the separators 2572 may be connected to each other in series. For example, a first separator primarily separates the carbon dioxide from the organic solvent. Then, a second separator is connected to the first separator to secondarily separate the carbon dioxide from the organic solvent. Thus, the separation of the organic solvent may be performed several times to obtain more pure carbon dioxide.

Also, the recycling unit 2570 may include a plurality of recyclers 2574. The recyclers 2574 may be connected to each other in parallel. Each of the first and second recyclers 2574a and 2574b may be connected to the separator 2572 to filter the organic solvent from the carbon dioxide, thereby supplying the filtered organic solvent into the supply unit 2560. When the plurality of recyclers 2574 are disposed in parallel, a large amount of carbon dioxide may be recycled for a short time. The recyclers 2574 may be connected to each other in parallel. A first recycler 2574a is connected to the separator 2572 to primarily filter the organic solvent from the carbon dioxide. The second recycler 2574b is connected to the first recycler 2574a to secondarily filter the organic solvent from the carbon dioxide. The separation of the organic solvent from the carbon dioxide by the recycler 2574 may be performed several times.

The circulation line 2600 successively connects the drying chamber 2500, the recycling unit 2570, and the supply unit 2560 to each other. The carbon dioxide is circulated through the circulation line 2600. The circulation line 2600 may include a circulation line 2601 connecting the drying chamber 2500 to the recycling unit 2570, circulation lines 2602a and 2602b connecting the inside of the recycling unit 2570, a circulation line 2603 connecting the recycling unit 2570 to the supply unit 2560, circulation lines 2604a and 2604b connecting the inside of the supply unit 2560, and a circulation line 2605 connecting the supply unit 2560 to the drying chamber 2500. A pump may be disposed on each of the circulation lines 2600.

Figure 5:
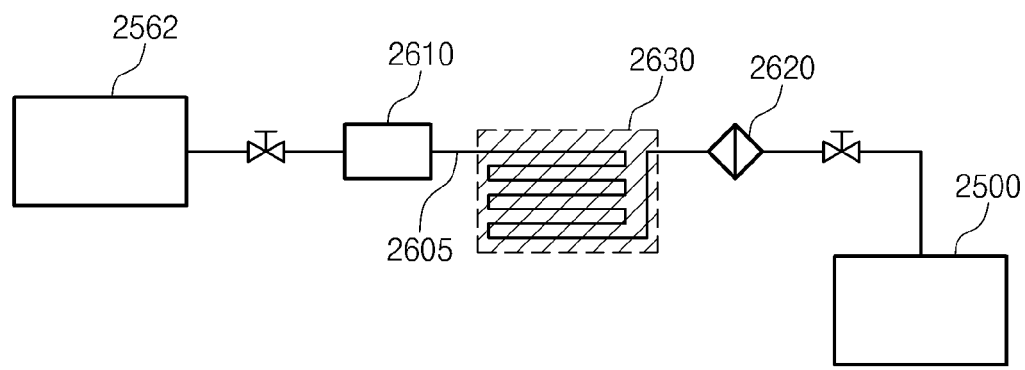
FIG. 5 is a view of a substrate treating apparatus according to an embodiment of the present invention.

FIG. 5 is a view of a substrate treating apparatus according to an embodiment of the present invention. Referring to FIG. 5, a substrate treating apparatus may include a first unit, a second unit, and a supply line. The first unit may be a water supply tank 2566. The second unit may be a drying chamber 2500. Also, the supply line may be a circulation line 2605 between the water supply tank 2566 and the drying chamber 2500. Hereinafter, the circulation line 2605 will be called a supply line 2605. The supply line 2605 connects the water supply tank 2566 to the drying chamber 2500. The supply line 2605 supplies a supercritical fluid from the water supply tank 2566 to the drying chamber 2500.

A flow rate adjustment member 2610, a filter 2620, and a heating member 2630 are disposed in the supply line 2605.

Figure 6:
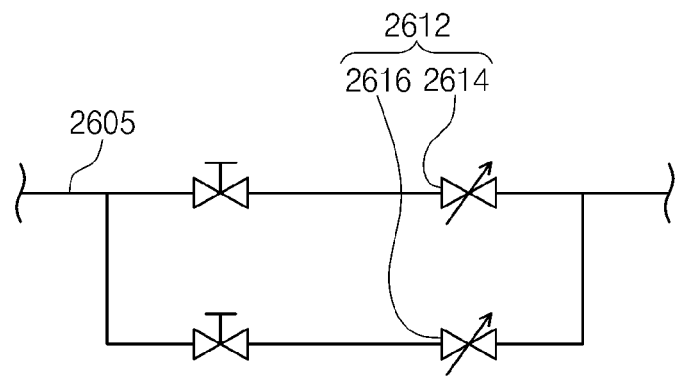
FIG. 6 is a view of a flow rate adjustment member.
Figure 7:
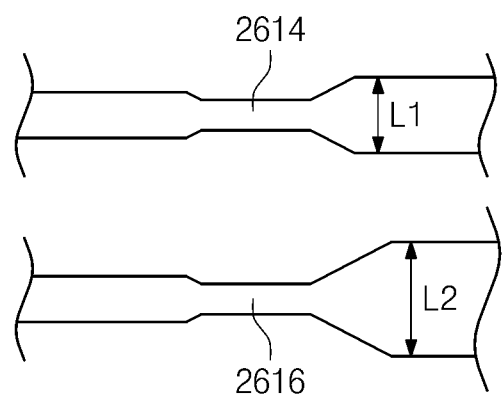
FIG. 7 is a cross-sectional view of an orifice of FIG. 6.

FIG. 6 is a view of a flow rate adjustment member 2610. FIG. 7 is a cross-sectional of an orifice 2612 of FIG. 6. The flow rate adjustment member 2610 may include the orifice 2612. The orifice 2612 may adjust a flow rate of the supercritical fluid. The orifice may be provided in plurality. For example, as illustrated in FIG. 6, two orifices may be provided in parallel. Here, the first and second orifices 2614 and 2616 may have diameters different from each other. For example, as illustrated in FIG. 7, the first orifice 2614 may have a diameter L1 less than that L2 of the second orifice 2616.

The filter 2620 removes foreign substances contained in the supercritical fluid. Here, the supply line 2605 disposed between the flow rate adjustment member 2610 and the filter 2620 may get out of a straight line. For example, the supply line 2605 disposed between the orifice 2612 and the filter 2620 may be disposed in a zigzag shape. Here, the supply line 2605 disposed between the orifice 2612 and the filter 2620 may have a length greater than that of the supply line 2605 disposed between the filter 2620 and the drying chamber 2500. For example, the supply line 2605 disposed between the orifice 2612 and the filter 2620 may have a length ranging from about 1 meter to about 5 meters. Also, as illustrated in FIG. 7, the supply line 2605 disposed between the orifice 2612 and the filter 2620 may have a diameter greater than that of the supply line 2605 disposed between the supply tank 2566 and the orifice 2612. Since the supply line 2605 disposed between the orifice 2612 and the filter 2620 increases in length or diameter, a heat transfer area for transferring heat of the supercritical fluid may increase. On the other hand, the flow rate adjustment member 2610 may include a metering valve. Also, the supply line 2605 may be lengthily disposed between the metering valve and the filter 2620.

Figure 8:
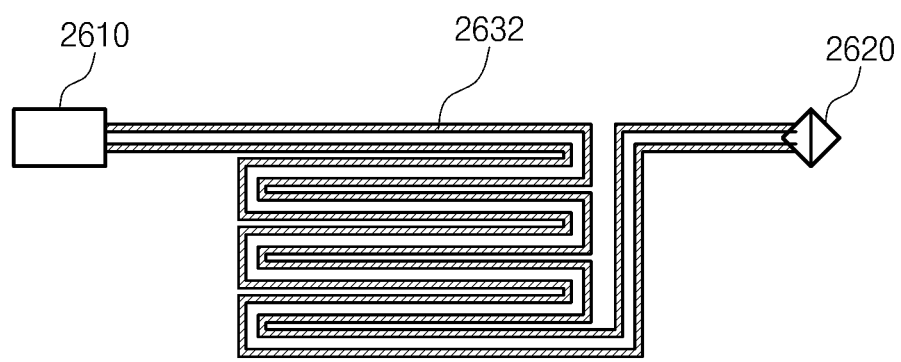
FIG. 8 is a view of a heating member according to an embodiment.
Figure 9:
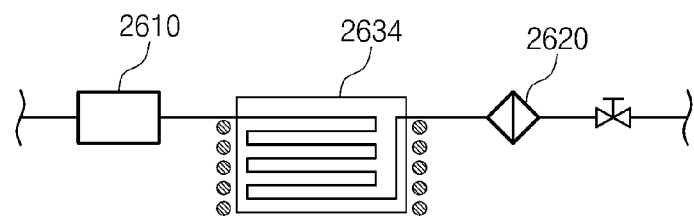
FIG. 9 is a view of a heating member according to another embodiment.

FIG. 8 is a view of the heating member 2630 according to an embodiment. FIG. 9 is a view of a heating member 2630 according to another embodiment.

The heating member 2630 heats a supply line 2605 disposed between the orifice 2612 and the filter 2620. As illustrated in FIG. 8, the heating member 2630 may be a heater that is disposed to surround the supply line 2605 disposed between the orifice 2612 and the filter 2620. As illustrated in FIG. 9, the heating member 2630 may be a housing 2634 that is disposed to surround the supply line 2605 disposed between the orifice 2612 and the filter 2620. Selectively, the heating member 2630 may include an in-line heater or regulator that is disposed on the supply line 2605 disposed between the orifice 2612 and the filter 2620. The regulator may decompress the supercritical fluid. On the other hand, the heater, the in-line heater, and the regulator may be combined with each other and provided in plurality.

Figure 10:
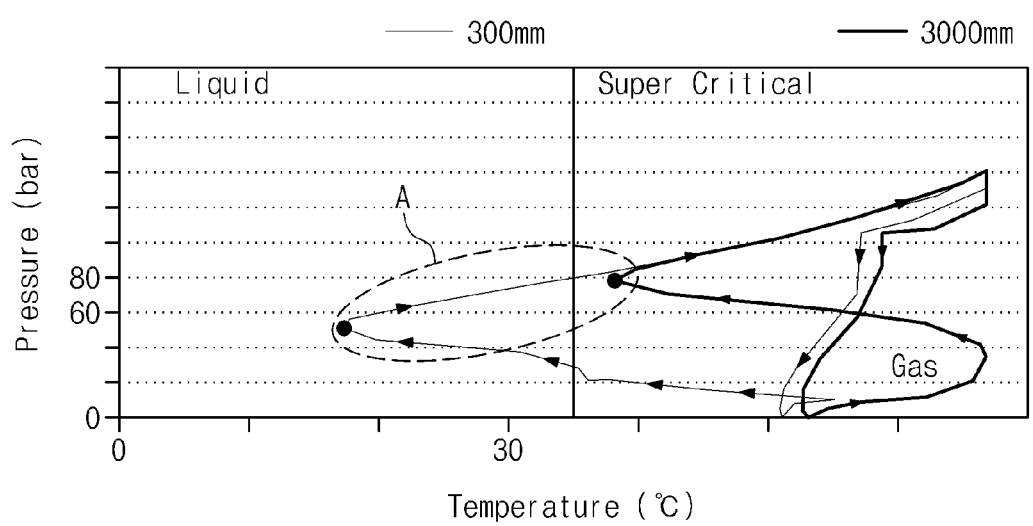
FIG. 10 is a graph obtained by comparing a phase change of a supercritical fluid according to a temperature and pressure when the typical substrate treating apparatus and the substrate treating apparatus of FIG. 5 are used.

FIG. 10 is a graph obtained by comparing a phase change of a supercritical fluid according to a temperature and pressure when the typical substrate treating apparatus and the substrate treating apparatus of FIG. 5 are used. A thin solid line may represent a phase change of the supercritical fluid according to the typical substrate treating apparatus. A thick solid line may represent a phase change of the supercritical fluid according to the substrate treating apparatus of the present invention. In the typical substrate treating apparatus, a supply line 2605 disposed between the flow rate adjustment member 2610 and the filter 2620 has a length of about 100 mm to about 500 mm. For example, the thin solid line of FIG. 10 may represent a phase change value measured through the supply line having a length of about 300 mm. The thick solid line of FIG. 10 may represent a phase change value measured through the supply line having a length of about 3,000 mm. As illustrated by a dotted line, the supercritical fluid in the typical substrate treating apparatus may change in phase from a supercritical fluid to a liquid by adiabatic expansion while passing through the orifice 2612. Thus, since the liquid supercritical fluid passes through the filter 2620, the filter 2620 for filtering foreign substances may be deteriorated in efficiency. On the other hand, in the substrate treating apparatus according to the present invention, the supply line 2605 may be lengthily disposed between the orifice 2612 and the filter 2620, and also the heating member 2630 may be additionally provided to minimize temperature drop of the supercritical fluid due to the adiabatic expansion when the supercritical fluid is supplied. Thus, as illustrated by the thick solid line of FIG. 10, the supercritical fluid may not change into the liquid phase. Therefore, the filter 2620 for removing the foreign substances may do not affect its filtering performance.

The process performed by the substrate treating apparatus of the present invention may be a supercritical process different from the above-described supercritical process. Furthermore, the substrate treating apparatus may perform the process by using a process fluid different from the supercritical fluid. Also, although the substrate treating apparatus supplies the supercritical fluid onto the substrate S to treat the substrate S, the present invention is not limited thereto. For example, the process performed by the substrate treating process may not be limited to the supercritical process. Also, a filter for minimizing an occurrence of particles may be additionally provided.

According to the embodiments of the present invention, the substrate treating apparatus that is capable of supplying the supercritical fluid having high purity may be provided.

The object of the present invention is not limited to the aforesaid, but other objects not described herein will be clearly understood by those skilled in the art from descriptions below.

The present invention has been described above with reference to the aforementioned embodiments. It is evident, however, that many alternative modifications and variations will be apparent to those having skill in the art in light of the foregoing description. Accordingly, the present invention embraces all such alternative modifications and variations as fall within the spirit and scope of the appended claims. Also, the embodiments set forth therein is not so limitedly, but all or part of the embodiments can be selectively combined so as to derive many variations.

What is claimed is:

1. A substrate treating apparatus comprising:
a first unit;
a second unit;
a supply line connecting the first unit to the second unit to supply a supercritical fluid from the first unit to the second unit;
a flow rate adjustment member disposed in the supply line; and
a filter disposed in the supply line to remove foreign substances,
wherein the supply line disposed between the flow rate adjustment member and the filter is disposed to get out of a straight line,
wherein the flow rate adjustment member comprises an orifice, and
wherein the supply line disposed between the orifice and the filter has a length greater than a length of the supply line disposed between the filter and the second unit.

2. The substrate treating apparatus of claim 1, wherein the supply line disposed between the orifice and the filter is disposed in a zigzag shape.

3. The substrate treating apparatus of claim 1, wherein the supply line disposed between the orifice and the filter has a length ranging from about 1 meter to about 5 meters.

4. The substrate treating apparatus of claim 3, wherein the supply line disposed between the orifice and the filter has a diameter greater than that of the supply line disposed between the first unit and the orifice.

5. The substrate treating apparatus of claim 4, wherein the orifice comprises a first orifice and a second orifice which are disposed in parallel to each other, and
the first orifice has a diameter different from that of the second orifice.

6. The substrate treating apparatus of claim 5, wherein the first orifice has a diameter less than that of the second orifice.

7. The substrate treating apparatus of claim 2, further comprising a heating member for heating the supply line disposed between the orifice and the filter.

8. The substrate treating apparatus of claim 7, wherein the heating member comprises a heater that is disposed to surround the supply line disposed between the orifice and the filter.

9. The substrate treating apparatus of claim 8, wherein the first unit comprises a supply tank for storing the supercritical fluid, and
the second unit comprises a process chamber in which a process is performed by using the supercritical fluid.

10. A substrate treating method for treating a substrate by using a supercritical fluid, the substrate treating method comprising:
supplying the supercritical fluid from a first unit to a second unit via a supply line;
adjusting a flow rate of the supercritical fluid in the supply line by a flow rate adjustment member; and
removing foreign substances contained in the supercritical fluid by a filter,
wherein the supply line disposed between the flow rate adjustment member and the filter is disposed to get out of a straight line,
wherein the flow rate adjustment member comprises an orifice, and
wherein the supply line disposed between the orifice and the filter has a length greater than a length of the supply line disposed between the filter and the second unit.

11. The substrate treating method of claim 10, wherein the supply line disposed between the orifice and the filter is disposed in a zigzag shape.

12. The substrate treating method of claim 11, wherein the supply line disposed between the orifice and the filter has a length ranging from about 1 meter to about 5 meters.

13. The substrate treating method of claim 12, wherein the supply line disposed between the orifice and the filter has a diameter greater than that of the supply line disposed between the first unit and the orifice.

14. The substrate treating method of claim 12, further comprising heating the supply line disposed between the orifice and the filter.

15. The substrate treating apparatus of claim 8, wherein the heater is an in-line heater.

16. The substrate treating apparatus of claim 8, wherein the heater is a regulator.

17. The substrate treating apparatus of claim 7, wherein the heating member is a housing which surrounds the supply line disposed between the orifice and the filter.

18. The substrate treating apparatus of claim 1, wherein the flow rate adjustment member includes a metering valve.

19. The substrate treating apparatus of claim 18, wherein the supply line is disposed between the metering valve and the filter.

20. The substrate treating apparatus of claim 1, wherein the supply line is a circulation line between the first unit and the second unit.

* * * * *